United States Patent [19]

Hana et al.

[11] Patent Number: 5,210,701
[45] Date of Patent: May 11, 1993

[54] APPARATUS AND METHOD FOR DESIGNING INTEGRATED CIRCUIT MODULES

[75] Inventors: Haytham H. Hana, Milton; Syed J. Hussain, Bellevue, both of Wash.

[73] Assignee: Cascade Design Automation Corporation, Bellevue, Wash.

[21] Appl. No.: 701,624

[22] Filed: May 14, 1991

Related U.S. Application Data

[63] Continuation of Ser. No. 351687, May 15, 1989, abandoned.

[51] Int. Cl.$^5$ .............................................. G06F 15/20
[52] U.S. Cl. ..................................... 364/491; 364/488
[58] Field of Search ................ 307/482; 364/488, 489, 364/490, 491; 365/189.04

[56] References Cited

U.S. PATENT DOCUMENTS

| | | | |
|---|---|---|---|
| 3,968,478 | 7/1976 | Mensch, Jr. ...................... | 364/491 X |
| 4,523,106 | 6/1985 | Tanizawa et al. ............... | 364/490 X |
| 4,600,995 | 7/1986 | Kinoshita ............................ | 364/491 |
| 4,849,904 | 7/1989 | Aipperspach et al. .......... | 364/488 X |
| 4,860,263 | 8/1989 | Mattausch ................... | 365/189.04 X |
| 4,866,677 | 9/1989 | Sakurai ........................ | 365/189.04 X |
| 4,972,324 | 11/1990 | Tanaka ............................. | 364/488 X |
| 5,031,111 | 7/1991 | Chao et al. ...................... | 364/488 X |

FOREIGN PATENT DOCUMENTS 0143366 6/1985 European Pat. Off. ............ 364/491

*Primary Examiner*—Parshotam S. Lall
*Assistant Examiner*—Edward R. Cosimano
*Attorney, Agent, or Firm*—Seed and Berry

[57] ABSTRACT

A method and apparatus for generating a multiport static random-access memory (SRAM) in an integrated circuit. The apparatus includes a tape drive for accepting parameters describing a particular technology process and a keyboard for accepting user specifications of a desired multiport RAM. The user specifications include the number of words the RAM is capable of storing, the number of bits comprising each word, the number of READ ports, and the number of WRITE ports. The apparatus includes a computer which has been programmed to automatically generate the layout of a RAM including a central memory array core, READ and WRITE address buffers and decoders, data input and output buffers, and sense amplifiers. In order to reduce the area covered by the RAM, the READ and WRITE address ports are generally positioned on opposite sides of the memory array core, but so that the number of ports on the opposite sides are as nearly equal as possible.

28 Claims, 6 Drawing Sheets

APPARATUS AND METHOD FOR DESIGNING INTEGRATED CIRCUIT MODULES

"This application is a continuation of U.S. patent application Ser. No. 07/351,687 filed May 15, 1989, now abandoned under C.F.R. §1.62."

DESCRIPTION

1. Technical Field

This invention relates to integrated circuit design tools. More particularly, this invention relates to a method and apparatus for generating the layout of a multiport random-access memory according to predetermined parameters.

2. Background Art

A monolithic integrated circuit is a combination of interconnected subcircuits containing circuit elements that are inseparably associated on or within a continuous substrate. Typically, the circuit elements are conventional components, such as transistors, diodes, capacitors, and resistors, fabricated in situ within or on a single crystal of semiconductor material with the capability of performing a complete electronic circuit function.

Typically, an integrated circuit is designed by first designing subportions of the integrated circuit. These subportions are then integrated to form an entire integrated circuit layout database. The database is used to form tooling and/or masks for conventional fabrication processes. The subportions may be strategically designed either by function, so the geometry may be used as an interchangeable module for various integrated circuit layouts, or as a building block in highly complex integrated circuits. Thus, the method is commonly referred to as "module generation."

One of the more common subcircuits contained within an integrated circuit is a random-access memory (RAM), such as a clocked static RAM formed on a complementary metal oxide semiconductor (CMOS) substrate. A RAM contains storage cells which retain information bits that can be written into the storage cells and can be subsequently read from the storage cells. It is well known in the prior art to generate RAM modules by means of computer programs. These module generator programs alleviate the designer of the tedious and mundane task of creating complex RAMs. However, they are limited to RAMs made according to fixed process technologies or fixed configurations, such as the number of bits that can be stored in the RAM.

Many memory-intensive applications, such as high-speed computing and digital signal processing, demand multiport RAMs, which provide the required high performance and density by increasing output and input access to the RAM's storage cells through multiple READ and/or WRITE ports. While three- and five-port RAMs in fixed process technologies are available as standard parts from certain vendors, they can be produced only in those particular configurations.

It would, therefore, be useful to a computer-aided designer of application-specific integrated circuits (ASICs) to have a multiport RAM module generator that is capable of integrating process technology, RAM size and configuration, and port specifications.

SUMMARY OF THE INVENTION

An object of this invention is to provide a method and apparatus for generating a multiport RAM in accordance with a specified process technology.

Another object of the present invention is to provide a method and apparatus for generating a multiport RAM having a specific storage cell configuration.

Still another object of the present invention is to provide a method and apparatus for generating a multiport RAM having specific input/output port configurations.

According to a first aspect, the invention is a method for generating a multiport RAM in accordance with a process technology. The method comprises the steps of specifying the process technology and the number of input and output ports for the RAM module. The number of words the RAM is capable of storing and the number of information bits composing each of the words are then specified. The layout of a core of addressable memory cells is designed in accordance with the specified process technology. In the next step, the layout of auxiliary circuitry surrounding the core of memory cells is designed.

The layout of the auxiliary circuitry can include both data output circuitry and data input circuitry. The data output circuitry can be adjacent a first side of the memory core while the data input circuitry can be adjacent a second side of the memory. Further, input and output address decoder circuitry, as well as control signal buffers, can be designed adjacent to the two remaining sides of the memory core.

DETAILED DESCRIPTION OF THE INVENTION

HARDWARE

Figure 1:
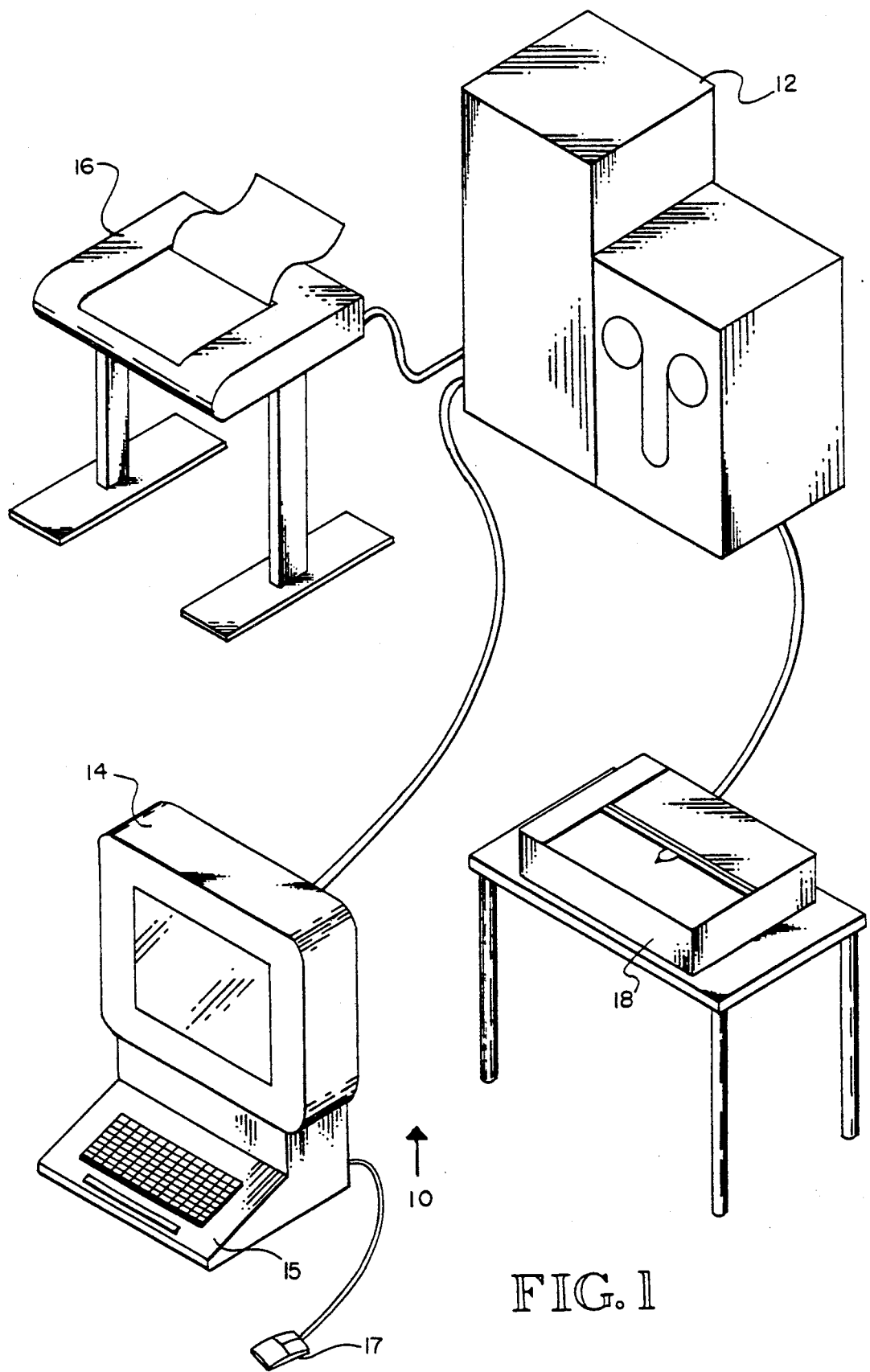
FIG. 1 is an isometric view of an embodiment of a circuit design station for designing integrated circuits.

Referring to FIG. 1, the preferred embodiment of the apparatus 10 for designing subcircuits in integrated circuits is a conventional computer system including a computer 12, terminal 14, printer 16, and plotter 18. The computer 12 includes a tape drive 13, which serves as a first input means, and also as an output means. The terminal 14 includes a keyboard 15 or mouse 17, which serves as a second input means. In one embodiment, the computer 12 is a DN3000 or DN4000-series computer manufactured by Apollo Computers; the printer 16 may be any one of a large number of available models; and the plotter 18 is an HP 7475A manufactured by Hewlett-Packard, Inc. The DN3000-series Apollo computer uses a UNIX version 4.2 operating system and a "C" program language generator, developed by Bell Laboratories. In the preferred embodiment, the method for designing integrated circuits is embodied within a Compiler Development System (CDS). Inputs to the apparatus 10 may be provided through the tape drive 13, the keyboard 15, or the mouse 17. Tape drive 13 is suitable for the input and output of large sets of data and data bases, such as descriptions of various process technologies, data structure tables, or geometry, simulation, and symbol data bases which may be produced by the system 10.

SOFTWARE

The computer system 10 is programmed with a set of software tools containing integrated circuit module generators, each consisting of source code and executable code. The integrated circuit module is an array of cells. Each cell, in turn, is the geometric definition of the required integrated circuit components. Every module can be combined, like a building block, with other modules in order to create a complete geometric description of an integrated circuit and a corresponding mask work.

One implementation of the software tools is expressed in a high-level language referred to as the "Silicon Generator Software Language for Integrated Circuits" (SLIC). Each SLIC command comprises, in one embodiment, a set of "C" language function calls. SLIC is a language for writing source code which, in turn, generates executable code. Execution of the executable code results in a specific geometry layout.

The multiport RAM module generator, developed using CDS, may be used with other module generators or alone to develop an integrated circuit layout. Typically, the software tools for developing module generators are used with other software in packages such as the ChipCrafter Generator produced by Seattle Silicon Corporation. These other software tools include programs for interconnecting modules, such as the Pride/Auto Route software tool within the ChipCrafter package.

Typically, a modular approach is used for designing a complex integrated circuit. In this approach, the circuit for each module is designed, tested, and debugged before it is integrated with other modules to form the complete integrated circuit layout and mask work.

Although the preferred embodiment of the method is a software embodiment designed to run on the VAX 11/785 having a Unix Version 4.2 operating system and a "C" compiler, other embodiments of the method could be software programs designed to run on computer systems using other computers, terminals, printers, and plotters with another operating system and programming language. Still other embodiments of the method need not take the form of a computer program or be implemented through a computer system.

SLIC is an extension language of the "C" programming language. SLIC is used to write geometry generator source code for generating a layout. A second extension language, GSSLIC, may be used to write simulation model source code for simulating the performance of the layout design. A third extension language, SSSLIC, may be used to write schematic symbol generator source code for deriving a schematic symbol for the module under development (e.g., the logic symbol for an 'OR' gate with inputs and outputs). Also, a fourth extension language, TSSLIC, may be used to write transistor models.

FLOOR PLAN OF RAM MODULE

Figure 2:
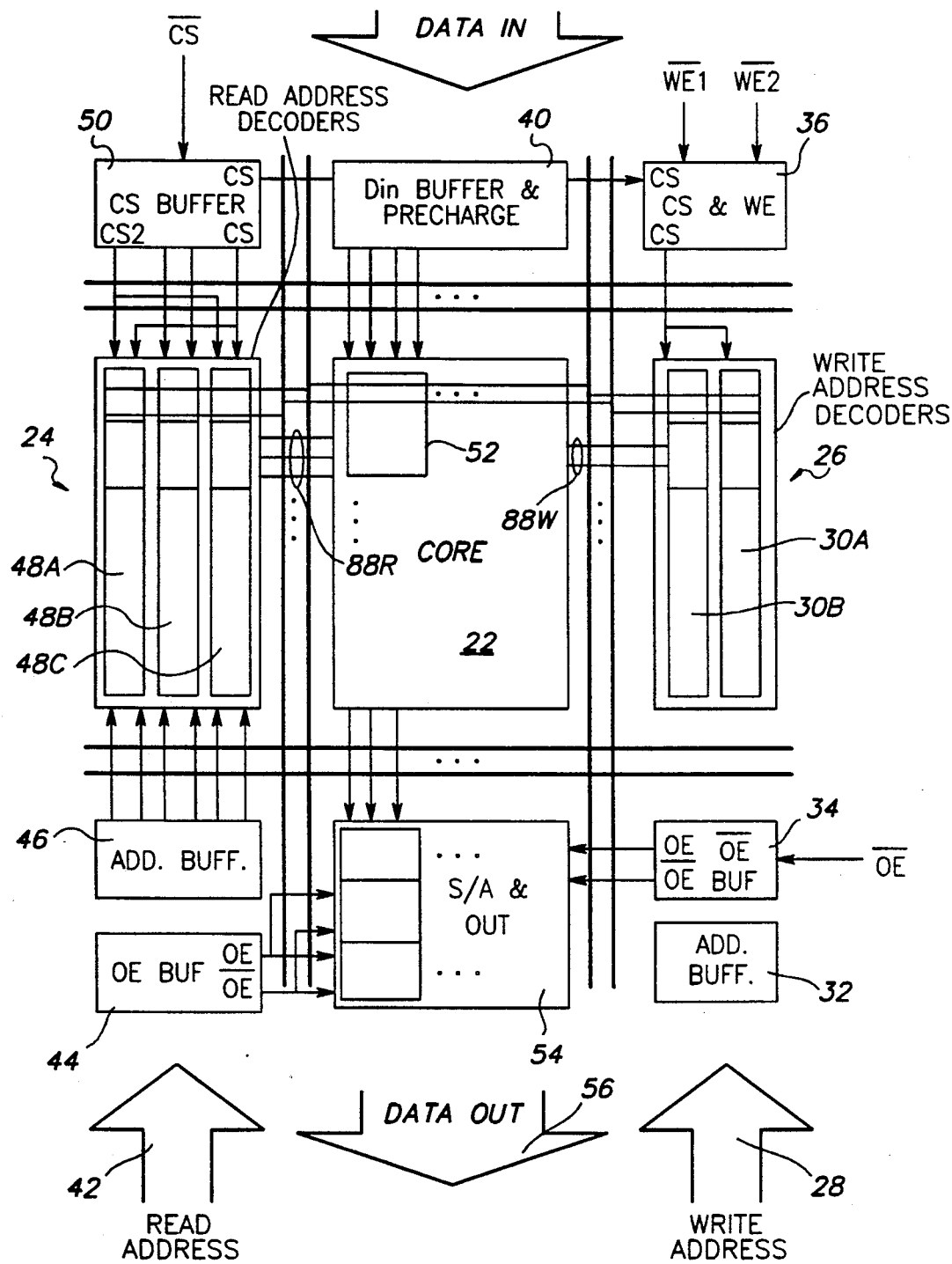
FIG. 2 is a floor plan of the multiport RAM module generated by the present invention.

FIG. 2 is a floor plan of a multiport RAM 20 generated by the method of the present invention. The multiport RAM 20 includes a memory array core 22 which is generally rectangular in shape. The address ports of the multiport RAM 20 are of two types: READ address ports 24 and WRITE address ports 26. These ports respectively cause data to be read from or written into the memory array core 22. As shown in FIG. 2, the READ address ports 24 can be placed on one side (e.g., the left side) of the memory array core 22, while the WRITE address ports 26 can be placed on the opposite side of the memory array core 22.

The WRITE address ports 26 control the designation of particular locations (or addresses) in the memory array core 22 into which data are to be written from a buffer and precharge circuit 40. The WRITE address ports 26 receive the write addresses from a write bus, signified by arrow 28. The WRITE address ports 26 include one or more write address decoders 30A, 30B, etc., which receive the write addresses through the address bus signified by the arrow 28, the address buffers 32 which is under control of the output enable buffer 34. The write address decoders 30A, etc., receive chip select (CS) and write enable (WE) codes from a control circuit 36. The CS and WE signals are produced elsewhere within the integrated circuit of which the multiport RAM 20 is a part.

When so designated by the write address decoders 30A, etc., particular address locations within the memory array core 22 are activated to receive data from an input data bus signified by the arrow 38. The input data, in the form of bits of information, are received by the data in the (DIn) buffer and precharge circuit 40. The input data are sent from the buffer and precharge circuit 40 to the specified address locations.

The data stored in address locations specified through the WRITE address ports 26 are retained in the memory array core 22 as long as electrical power is provided to the memory array core 22. If desired, the information bits, which are typically stored in the form of a word containing a specified number of bits, can be read out by one or more READ address ports 24.

The READ address ports 24, under the control of the CS and OE signals, receive read addresses from the read address bus denoted by the arrow 42. The read address information passes through the output enable buffer 44 and the address buffer 46, to the read address decoders 48A, etc. Upon activation by the CS signal, which passes through the chip select buffer 50, the read addresses specified by the respective read address decoders 48A, etc., designate particular cells in the memory array core 22 which are to be read. By this arrangement, it is possible for more than one read address decoder 48A, etc., to read a given memory cell 52. Upon being designated by a read address decoder 48A, etc., the information bits contained within a designated memory cell in the memory array core 22 are read from the memory cell (without changing the contents of the location) into sense amplifier and output circuitry 54. When the circuitry 54 receives the appropriate signals from the output enable buffers 34 and 44, the data detected by the sense amplifiers is passed on to a data output bus signified by the arrow 56.

Because of its multiport capability, the multiport RAM 20 must include memory cells 52 which can be independently addressed by write address decoders 30A, etc., and read address decoders 48A, etc. While the specific example of a multiport RAM 22 shown schematically in FIG. 2 includes two WRITE address ports 26 and three READ address ports 24, in principle, the numbers of WRITE and READ address ports can be chosen arbitrarily and independently. In practice, however, it has been discovered that most instances of a multiport RAM will have one or two WRITE address ports and one through 4 READ address ports, with the total number of address ports ranging between three and six.

A smallest multiport RAM 20 will generally result if the number of address ports on the left and right sides of the memory array core 22 is kept as nearly balanced as possible. For example, in a design having two WRITE address ports 26 and four READ address ports 24, the smallest area multiport RAM 20 results when one side of the memory array core 22 contains three READ address ports 24 and the opposite side of the memory array core 22 contains two WRITE address ports 26 and one READ address port 24. The reason is that the spacing between individual memory cells is determined in large part by the number of lines accessing each of the cells. In order to minimize the required spacing, the number of lines accessing each memory cell 52 from the left should be made as equal as possible to the number of signal lines connected to the memory cell 52 from the right.

Additional considerations allow further area reductions in the multiport RAM 20. Among these are sharing of power rails and other common features between parallel structures. For example, the write address decoders 30A, etc., can, where appropriate, share power rails and grounds.

The RAM disclosed in the present best mode for carrying out the invention is illustrated as a static RAM, alleviating the design from any recharge circuitry that is required by a dynamic RAM. While adding the recharge circuitry to the multiport RAM 20 complicates the layout of the multiport RAM 20, a dynamic RAM can still be realized by the method of the present invention and, accordingly, falls within the scope of the present invention.

Figure 3:
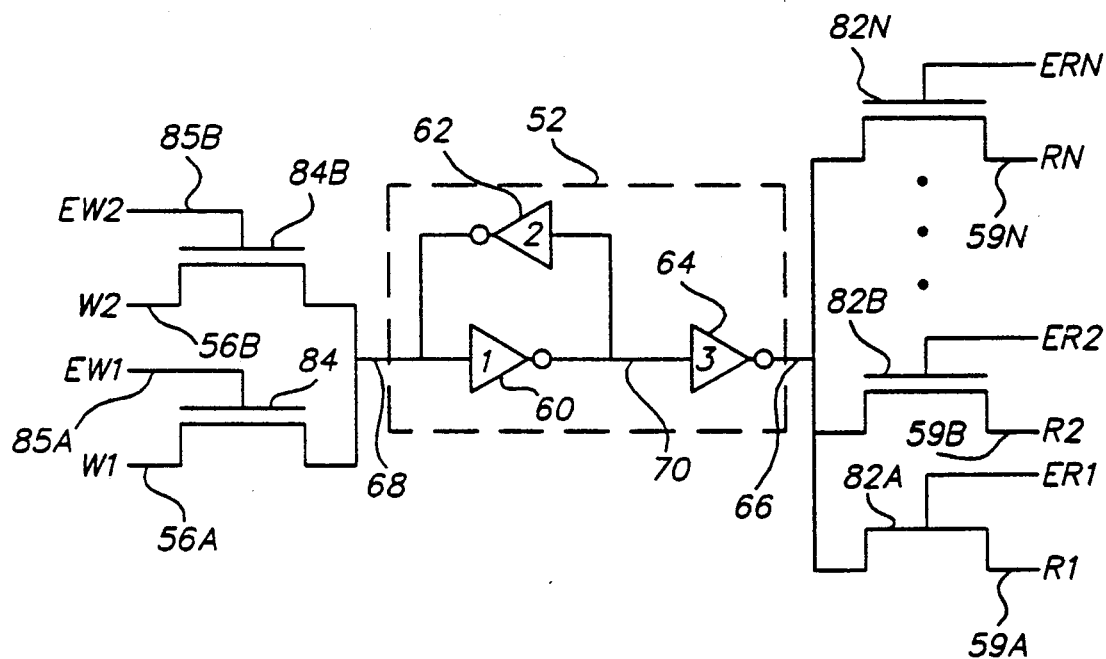
FIG. 3 is a schematic diagram of a single RAM cell in a multiport RAM cell array.

FIG. 3 is a schematic diagram of a single RAM cell 52. The RAM cell 52 is a single-ended, six-transistor cell which is known for reliable operation. It is discussed by Chan Tzoyao et al., in "Advanced Structured Arrays Combine High Density Memories with Channel-Free Logic Array," IEEE 1987 Custom Integrated Circuits Conference, pp. 39-43. The cell array 52 also features low power consumption, as described by P.S. Bennett et al., in "Embedded RAM in Gate Arrays: Configurability and Testability," VLSI System Design, November 1987, pp. 60-66.

The RAM cell 52 consists of three inverters 60, 62 and 64. An information bit is written into and read out of the RAM cell 52 through bit lines. The bit lines are lines 58A, etc., and lines 59A, etc. The RAM cell 52 is selected, in terms of its address, through one or more word lines. The word lines are write lines 88W and read lines 88R (see FIG. 2). During a READ operation, the inverter 64 provides an isolation stage between the output, on line 66, and the feedback arrangement consisting of inverters 62 and 64. The inverter 64 accordingly prevents the bit lines from perturbing the inverters 60 and 62 and eventually corrupting the data during possible simultaneous reads from the same cell 52.

The RAM cell 52 has READ and WRITE (i.e., output and input) ports that can be accessed asynchronously during each cycle of the integrated circuit's clock. An active low CS control signal (FIG. 2) is used to synchronize the RAM operations. Furthermore, each READ and WRITE port has an active low control signal, an address bus, and a data bus associated with it. Chip select divides the cycle time into two periods. During the first period, the bit lines and the address decoders are precharged and set up for the second half of the cycle. An evaluation period then follows, in which the word lines are enabled and, based on the state of the control lines, a READ and/or a WRITE operation occurs.

A single write enable (WE) control signal is used by each WRITE port to control the write operation. The pulse width of the WE signal is essentially the time required to write the input data into the RAM. The output of the data from the RAM is controlled by an output enable (OE) signal for each READ port. Thus, the OE signal provides the user with a window during which the stored data can be read, as well as providing tri-state capability for the output data bus.

Dynamic address decoding was selected for faster response and higher density, especially in larger RAM configurations (e.g., with a larger number of words). The write address decoders 30A, etc., precharge while CS is high and evaluate the address bus while CS is low. In the event that WE remains low for extended periods of time, and to allow for extended write operations, a charge keeper circuit was added to prevent the word lines from discharging due to leakage. Therefore, WE can be remain low as long as CS is low, permitting the input data bus to change within that time window as long as the setup and hold times of the relevant signals are satisfied. In addition, due to the clocked nature of the RAM, address translation detection was not necessary. This facilitated higher performance of the RAM module.

To maintain higher density and furnish tri-state capability, a combination of a high threshold inverter and a clocked inverter was used to sense a change in the bit lines and to drive the output data bus, respectively. The high threshold inverter was designed to detect a 1:0 transition in the bit lines, with a fast response time. Reading a "1" will not change the state of this inverter since the bit lines are precharged. The clocked inverter is controlled by OE and its output is in a tri-state condition when OE is high. Also, the clocked inverter is designed to accept user-specified buffer sizes, for variable drive capability of the output data bus.

The schematic diagram of FIG. 3 illustrates a single RAM cell 52 which can be accessed by two WRITE ports 26 and a number of READ ports 24 (see FIG. 2). Each of the WRITE ports 26 is activated by a separate "enable write" signal (88WA and 88WB). External control circuitry should be provided to allow at most one of the enable write signals to be active at a particular time. The READ ports produce signals (R1, R2 . . . , RN) which are enabled by respective "enable read" signals (ER1, ER2, . . . , ERN).

When an information bit (e.g., logic "0") is to be stored in the memory cell 52, a voltage representing the logic "0" appears on input signal line 68. The "0" can be written from either W1 or W2. The "0" is inverted by the inverter 60 to produce an inverted signal on storage line 70. When this signal is detected on storage line 70, it is inverted by the inverter 62, enforcing the voltage which appeared on input line 68 through one of the WRITE ports 26. The inverter 64 inverts the voltage stored on the storage line 70 and produces an output voltage on the output line 66 which represents the input signal which was fed through the input line 68. The voltage at the output line 66 can then be read by as many of the READ ports R1, R2, ... RN as may desire access to the contents of the memory cell 52.

GENERATOR DESCRIPTION AND STRUCTURE

The generator accepts high-level specifications of the desired multiport RAM 20 as inputs. These specifications include 1) the number of words to be stored in the multiport RAM 20, 2) the number of information bits per word, and 3) the number of WRITE ports 26 and READ ports 24. Given this information, the module generator then creates a view of the geometry view of the basic cells (placing and routing them together), and, if desired, a simulation view, and the representative schematic symbol. A transistor level net list of the resulting layout of the multiport RAM 20 is also created and used as a reference for verification against the extracted layout.

An internal auto buffer-sizing routine has been developed to help maintain the high performance of the multiport RAM 20. Before the geometry, simulation and transistor net-list views are created, the auto buffer-sizing routine determines the required buffer sizes of the interacting cells, based on their individual capacitive loading. A two-pass procedure which is used in this routine sizes the relevant cells' outputs in order to maintain an equal rise and fall time.

The first pass calculates the load capacitance on the output of each cell based on an initial driver buffer size of 1X. This is defined as the buffer size of a minimum size inverter using the appropriate k ratio between the NMOS and PMOS devices in the CMOS circuitry. This capacitive load is then used to determine the required buffer size of the driving stage, i.e., the transistor sizes of the driving stage.

In the second pass, the buffer size calculated from the first pass is used to calculate the additional capacitance which must be added to the nets due to the new cell buffer size. The resultant new load is, in turn, used to calculate the final cell buffer size. Thus, the layouts of the component cells are changed dynamically, based on their buffer sizes. The capacitances calculated from the routine described above are also used to estimate the timing parameters used in creating the simulation view.

The multiport RAM generator allows the user to vary the number of READ ports 24 and WRITE ports 26, the number of words to be stored, the number of bits per word, and the output driver size. In practice, it has been determined that a practical range of the number of words is between 4–128. The generator can also accept a practical number of bits per word in the range of 4–64. Finally, the output driver size can vary between one and four times the buffer size of a minimum size inverter.

The multiport RAM generator also performs internal buffer sizing and is capable of generating internal cells with varying buffer sizes. This requires that the layout of cells making up the multiport RAM must be very modular and flexible.

Figure 4B:
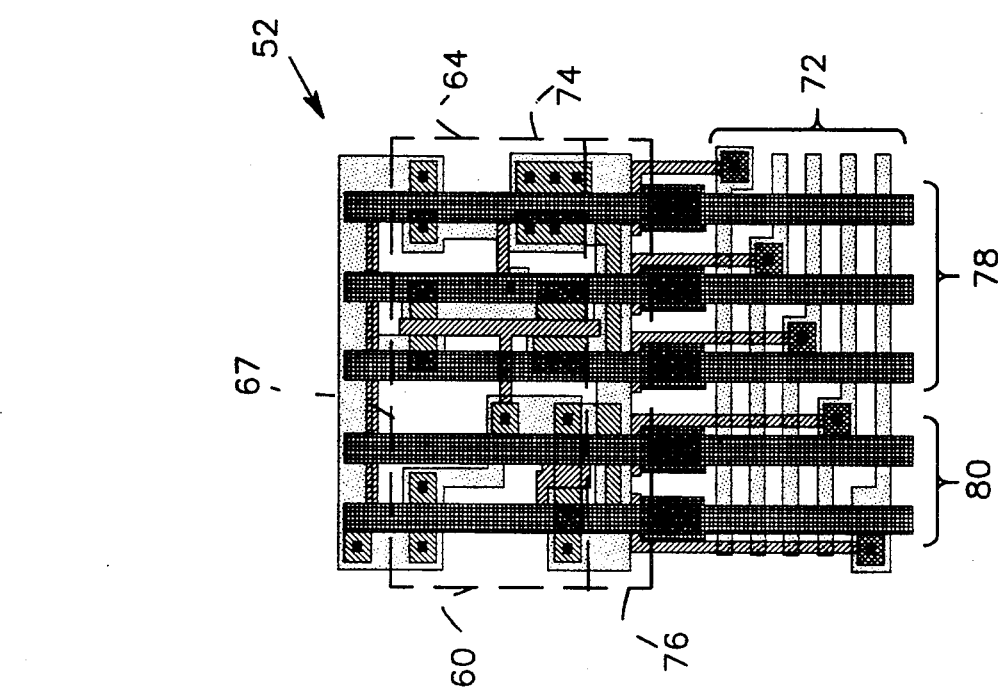
FIG. 4B is a layout of a RAM cell in a 1.2-micron process technology.
Figure 4A:
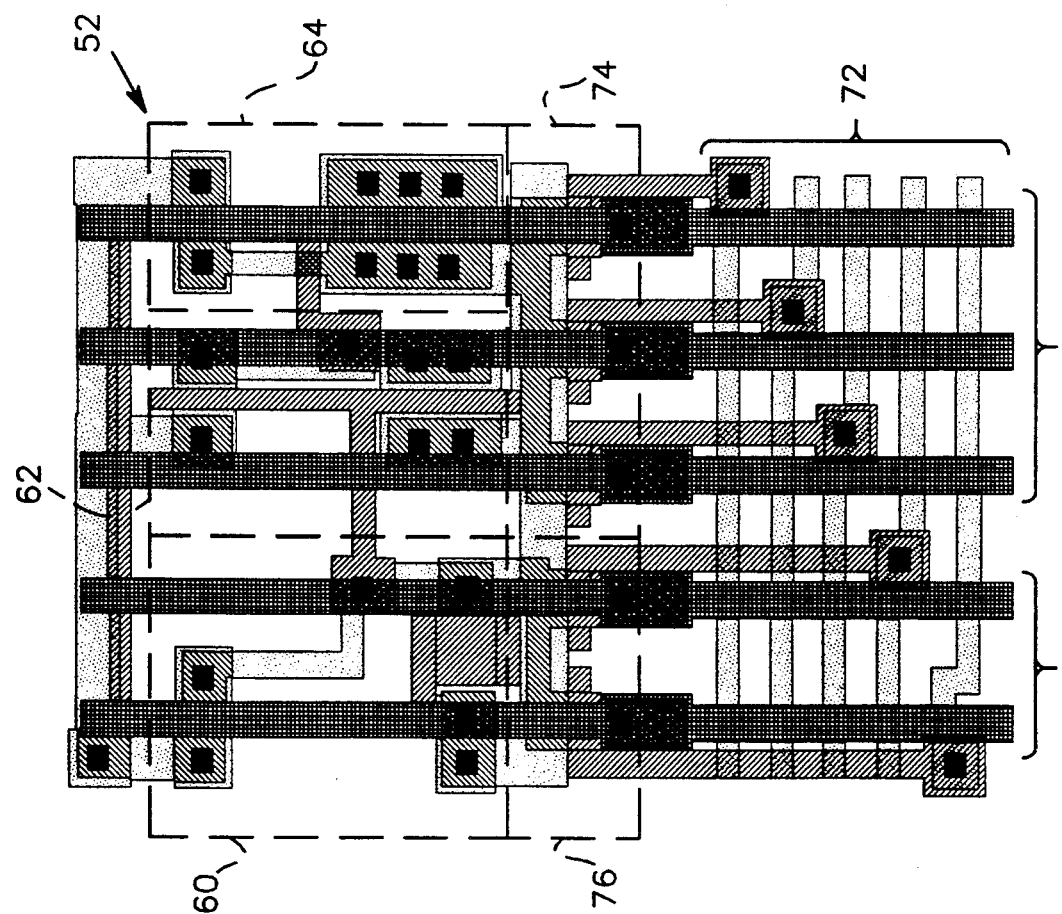
FIG. 4A is a layout of a RAM cell in a 2-micron process technology.

The basic RAM cell, as seen in FIG. 3, required careful design, since this basic design is most affected by a change in the number of ports. For example, as shown in FIGS. 4A and 4B, each single RAM cell 52 has word lines 72 at the bottom. The word lines are formed in a first metal layer. The RAM cell 52 also includes the read transistors 74 and the write transistors 76 in the middle portion of the RAM cell 52. The read transistors 74 are fed by the read lines 78, while the write transistors 76 are fed by the write lines 80. The three inverters 60, 62 and 64 comprise the upper portions of the RAM cells shown in FIGS. 4A and 4B. The read and write bit lines 78 and 80 are formed in a second metal layer. A change in the number of ports requires a change in the number of bit lines 78 or 80 and word lines 72 coming to the cell, as well as the number of read pass transistors 82A, etc., and write pass transistors 84A, etc. which are enabled by appropriate signals on the enable write lines 85A, etc. (see FIG. 3). As may be seen from FIGS. 4A and 4B, changing the number of bit lines 78 and 80 and word lines 72 is not difficult.

Figure 5:
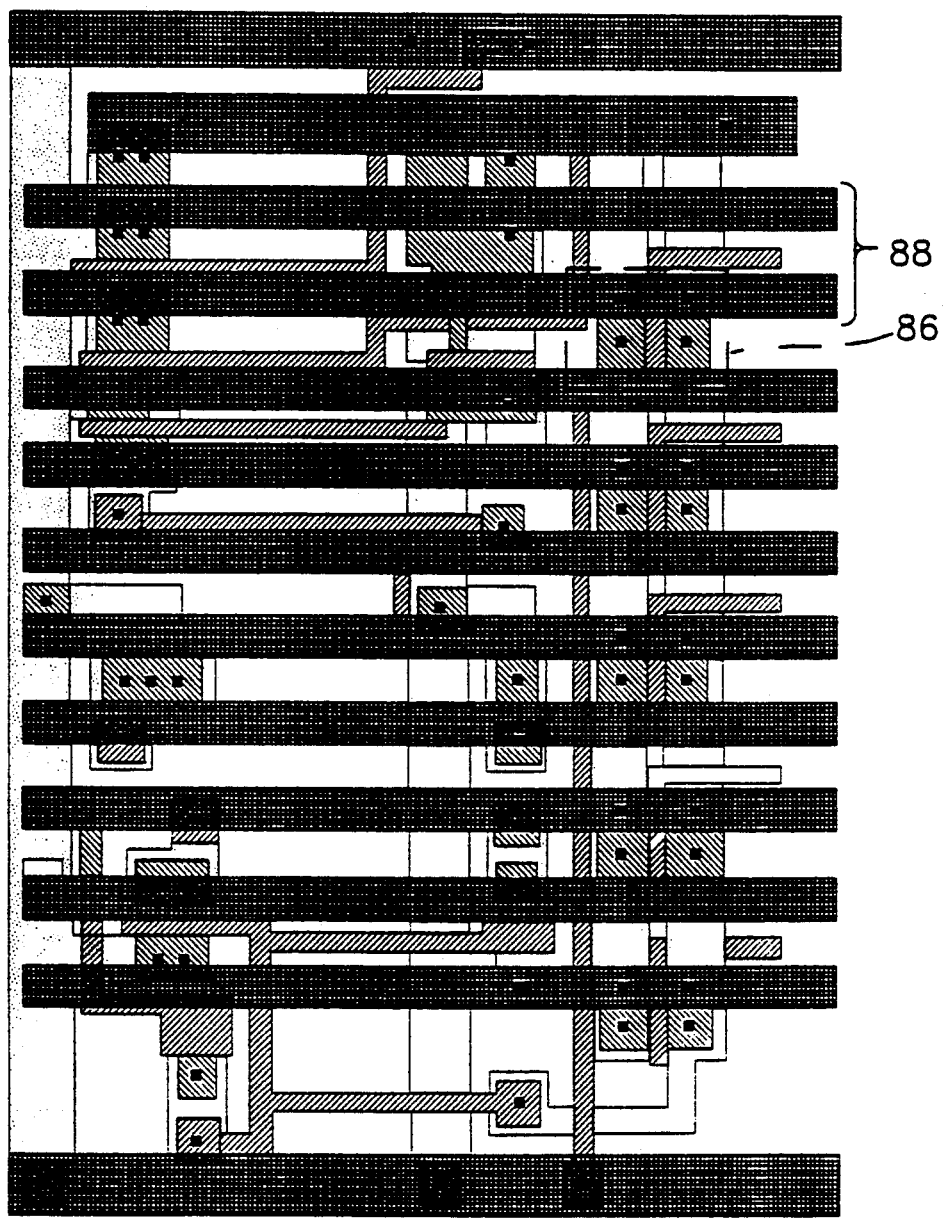
FIG. 5 is a layout of an address decoder used in the multiport RAM generated by the present method.

Occasionally, a change in the number of address lines is necessitated by a change in the number of words that can be stored in the memory array core 22, the read and write address decoders 30A, etc., and 48A, etc., as shown in FIG. 5. To accommodate such a change the generator uses a layout strategy similar to that for the basic RAM cell 52. In the layout of an address decoder, the address transistors 86 are placed under the address lines 88. Each pair of internal address lines 88 corresponds to a single address transistor 86. Thus, for every additional external address line, two internal address lines are added, creating space for the extra address transistor 86 which is needed. To save layout area, the internal address lines are placed over the decoder circuity in second metal. The decoder for a particular word is connected to the internal address lines 88 by vias (not shown). The placement of the vias is determined by a binary counting scheme.

The multiport RAM generator places and routes the various subcircuits comprising the multiport RAM 20 by generating a floor plan like that shown in FIG. 2. The corners of the floor plan are used to place the internal buffers. The layout geometry for these buffers is generated using a conventional "available area layout" method which fits the cells into the available corner space. Accordingly, these buffers can be forced to take a sinuous form if necessitated by the aspect ratio of the corner into which that internal buffer is to be placed.

Once routed, interacting subcircuits in the particular multiport RAM layout are pitch-matched. This is accomplished by forcing the heights and widths of all interconnected features to be identical. One particular advantage of pitch-matching is that it avoids jogs in the word lines connecting the subcircuits. In accordance with this step, the read and write address decoders 24 and 26 are pitch matched to the memory array core 22. Similarly, the DIn buffer and precharge circuit 40, the sense amplifier and output circuit 54, and the memory array core 22 all have the same widths. The signal and power routing in the multiport RAM 20 follows the general rule that all horizontal signals are in the first metal layer and all vertical signals are in the second metal layer. This ensures simpler and more efficient routing which can promote higher performance and density.

Figure 6:
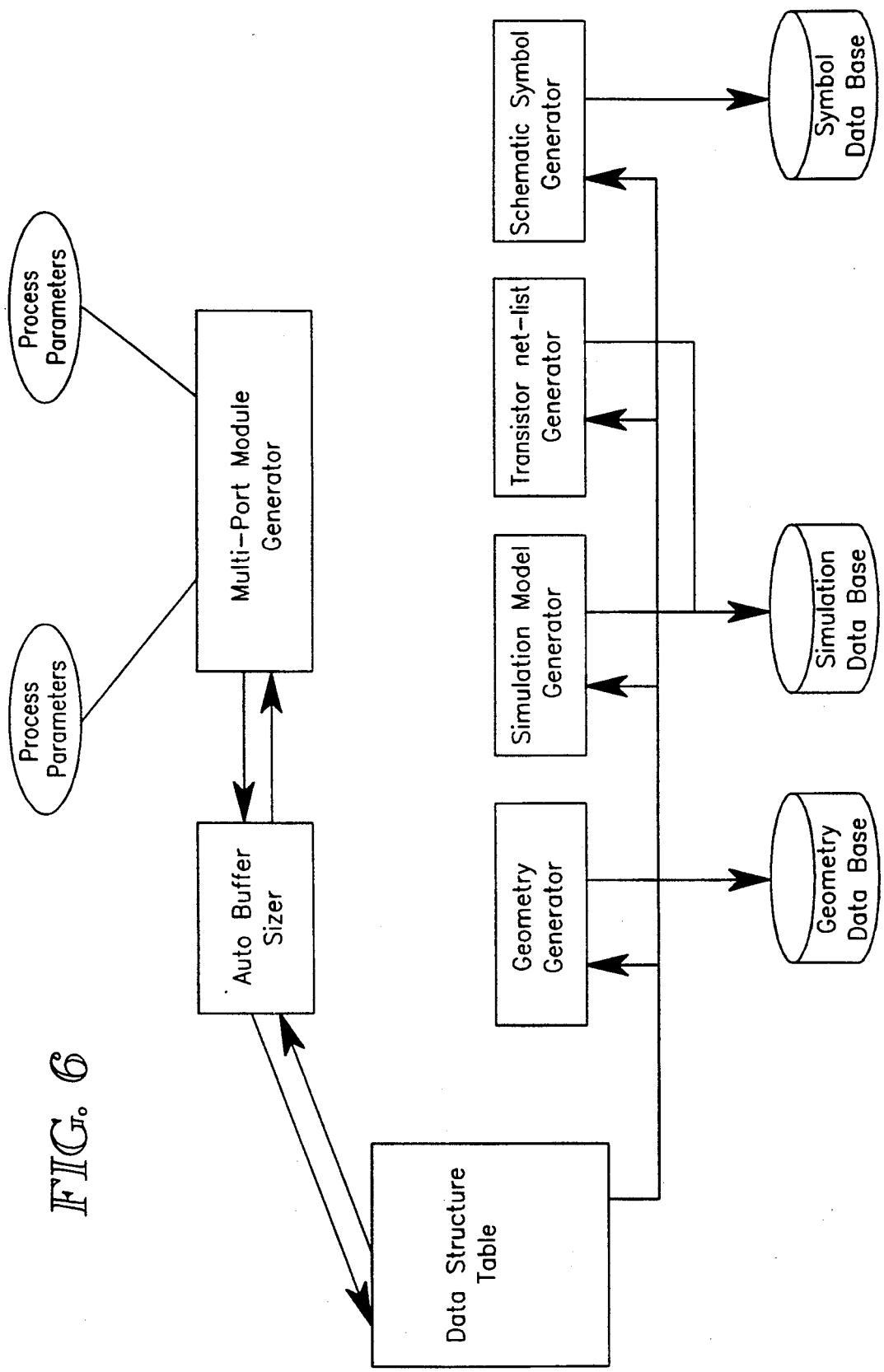
FIG. 6 is a flow chart of the multiport RAM module generation process of the present invention.

FIG. 6 is a flow chart of the multiport RAM module generation process of the present invention. Multiport RAM module generator 100 receives inputs from a process technology data base 102 as well as user's specifications 104. The user specifications 104 include the number of READ and WRITE address ports, the number of words to be stored, the number of bits per word, and the output driver size.

From these data, the generator 100 produces data which are sent to the auto buffer sizer 106. The auto buffer sizer 106 automatically establishes the sizes of the address buffers 32 and 46, the DIn buffer and precharge circuit 40, the output enable buffer 34 and 44, and the chip select buffer 50. The auto buffer sizer 106 also interacts with the data structure table 108 to determine the optimal size and aspect ratio of the various buffers. The auto buffer sizer 106 also interacts with the generator 100 to determine the placement and sizes of the other subcircuits in the multiport RAM, such as the READ and WRITE ports 24 and 26 and the sense amplifier and output circuitry 54. Accordingly, the auto buffer sizer 106 helps to maintain the high performance of the multiport RAM by sizing the interacting subcircuits based on their individual capacitive loading.

Once the generator 100 has established the sizes of the various subcircuits within a particular instance of a multiport RAM 20, the generator 100 directs any of a number of additional generators to operate. These generators are the geometry generator 110, the simulation model generator 112, the transistor net list generator 114, and schematic symbol generator 116. Each of these generators also receives data from the data structure table 108.

The geometry generator 110 produces a data base which describes the geometry of a particular layout of a chosen multiport RAM 20. The schematic symbol generator 116 produces a symbol which is suggestive of the multiport RAM 20 which has been designed according to the process technology data base 102 and the user specifications 104. These generators respectively produce the geometry data base 118 and the symbol data base 120. The simulation model generator 112 and the transistor net list generator 114 both produce data which is required for the simulation data base 122.

The simulation view created by the multiport RAM generator is a behavioral level model such as may be generated using the behavioral language model produced by Mentor Graphics. The relevant capacitances and resistances calculated in the buffer-sizing routine are used to perform resistance-capacitance (RC) calculations to estimate timing parameters such as setup time, hold time, and access time. The behavioral level model uses these timing parameters to perform checks against the user's input stimuli during simulation. Warning and error messages signal the user in the event of any timing violation. Based on the user-specified input stimuli, the behavioral level model then updates the states of the internal as well as the output nets, if required.

The generator also produces a transistor net-list view. This view is used to perform verification against the extracted layout of the RAM geometry. In addition, the transistor net-list can be converted to a generic SPICE net-list. The SPICE net-list can be used for calibration and accuracy of the timing parameters of the resulting multiport RAM.

The RAM generator 100 accepts foundry-specified design rules as global variables that can be initialized when the generator 100 is run. These global variables are used to calculate constraints between geometry elements in each subcircuit of a particular instance of a multiport RAM, producing a virtual grid of landmarks. The geometry elements are then placed on these landmarks to create the particular subcircuit.

The constraints used to calculate the landmarks are equations based on design rules that govern spacings between widths of geometry polygons. Each calculated landmark may represent one geometry element or a collection of polygons. Hence, once the origin landmark has been established, each successive landmark will include a previous landmark in its constraint equation, causing the grid to be tightly interdependent. A change to any one landmark value will result in a change to the entire grid. Thus, the layouts of the multiport RAMs are extremely dynamic and take full advantage of design rules for maximum density.

Migration to a smaller feature size process, or to a different foundry process, can be achieved by simply reinitializing the global variables and creating the geometry using the module generator 100. This produces a non-linear shrink in the geometry with superior density results than would occur with a linear shrink. FIGS. 4A and 4B compare a layout in a 2 micron process technology (FIG. 4A) with the layout in a 1.2 micron process technology (FIG. 4B).

To illustrate the changes encountered when scaling down the design of a multiport RAM cell, Table 1 presents die area and performance data for two different 5-port RAMs generated by the module generator 100. These RAMs have three READ and two WRITE ports each, and were created using a 1 micron twin-well process technology. The entries in Table 1 would vary with the number of ports or if a different process technology were chosen. As shown in Table 1, while the total number of bits that can be stored in the memory array core 22 increases by a factor of 8, the die area increases by a factor less than 8. Also, the access time, which is the time required for three simultaneous read operations from the same address, increases at a rate that is less than proportional to the size increase of the memory array core 22. If fewer simultaneous reads were to occur from the same address, the access time would be less than those shown in Table 1.

TABLE 1

| AREA AND PERFORMANCE DATA FOR TWO DIFFERENT 5-PORT CONFIGURATIONS | | |
|---|---|---|
|  | 32 words x 32 bits | 128 words x 64 bits |
| Die Area (mm$^2$) | 4.01 | 31.2 |
| Access Time (ns) | 15.01 | 20.01 |
| Cycle Time (ns) | 26.0 | 31.7 |

Table 2 compares the heights and widths of three basic RAM cells. These are a threeport cell, a fiveport cell, and a sixport cell, created according to both 1.2 micron and 2.0 micron process technologies. There is clearly a non-linear change in dimension between the two processes. This non-linear change can be attributed to the manner in which the generator uses the design rules to calculate the constraints and optimize the layout for each process. Note that the width of the threeport cell is the same as the width of the fiveport cell in the 1.2 micron process but not in the 2.0 micron process. This is due the fact that different constraints set the width of the same cell in different process technologies.

TABLE 2

RAM CELL DIMENSIONS FOR MULTIPLE PROCESSES AND NUMBER OF PORTS

|  |  | 2.0 u Process | 1.2 u Process |
|---|---|---|---|
| 3-Port Cell | Height | 82 | 52 |
| (1 WRITE & 2 READ) | Width | 53 | 38 |
| 5-Port Cell | Height | 92 | 60 |
| (2 WRITE & 3 READ) | Width | 59 | 38 |
| 6-Port Cell | Height | 98 | 63 |
| (2 Write & 4 READ) | Width | 72 | 45 |

While a preferred embodiment of this invention has been described, the invention is capable of modification and addition without departing from its basic principles. Accordingly, the invention is not intended to be limited to the exact embodiment illustrated, which is presented only as an example. The scope of the invention should be determined by reference to the claims and their equivalents, interpreted in light of the prior art.

We claim:

1. An apparatus for generating an integrated circuit module, said apparatus comprising:
   input means for accepting a plurality of parameters designating the characteristics of said integrated circuit module;
   memory means for storing a plurality of respective cells for a variety of integrated circuit subcomponent types, each type of said cells corresponding to a respective subcomponent of the integrated circuit module; and
   generator means operatively connected to said input means and said memory means to selectively receive said parameters from said input means and said cells from said memory means, said generator means combining a plurality of said cells to form said integrated circuit module, the number and type of said cells used in the integrated circuit module varies according to said parameters, said generator means further arranging the topology and interconnection pattern of at least some of said cells as a function of a characteristic of another of said cells.

2. The apparatus of claim 1 wherein said generator means arranges the topology of at least some of said cells as a function of the number of cells of another type that are included in said integrated circuit module.

3. The apparatus of claim 1 wherein said generator means arranges the topology of at least some of said cells as a function of the size of another cell that is included in said integrated circuit module.

4. The apparatus of claim 1 wherein said generator means comprise:
   means for generating a floor plan of said cells by determining the respective positions of said cells and then routing interconnections therebetween;
   means for pitch matching those of said cells that interact with another of said cells;
   buffer sizing means for determining the required buffer sizes of those of said cells that interact with another of said cells based on the respective capacitive loading of each of said cells; and
   means for generating data that describes the geometry of said integrated circuit module.

5. The apparatus of claim 4 wherein said input means further includes means for accepting a plurality of foundry-specific design rules, and wherein said generator means includes means for calculating constraints in the geometric relationships between said cells based on said design rules.

6. The apparatus of claim 4 wherein said means for determining the required buffer sizes of said interacting cells includes means for calculating the load capacitance of the output of each cell based on a predetermined initial driver size, and means for modifying each of said required buffer sizes by calculating the additional capacitance which must be added as a function of a new buffer size thereby calculating the final buffer size.

7. The apparatus of claim 1 wherein said integrated circuit module is for a multiport random access memory (RAM), and wherein said input means receives respective parameters indicative of the number of words to be stored in said RAM, the number of information bits for each of said words, the number of write ports for said RAM, and the number of read ports for said RAM.

8. The apparatus of claim 7 wherein said memory means has stored therein a first cell for a core of addressable memory cells, and a second plurality of cells for respective auxiliary circuitry, and wherein said generator means combines said first cell and said second plurality of cell to form said integrated circuit module.

9. The apparatus of claim 8 wherein said second plurality of cells include at least one data input circuit cell and at least one data output circuit cell, and wherein said generator means positions each of said input circuit cells on a side of said first cell opposite each of said output circuit cells.

10. The apparatus of claim 9 wherein said generator means places in said integrated circuit module a plurality of input circuit cells corresponding in number to the number of write ports specified in the parameters input to said input means.

11. The apparatus of claim 10 wherein said generator means adjusts the sizes of each of said input circuit cells to correspond to the number of information bits for each of said words specified in the parameters input to said means.

12. The apparatus of claim 9 wherein said generator means places in said integrated circuit module a plurality of output circuit cells corresponding in number to the number of read ports specified in the parameters input to said input means.

13. The apparatus of claim 12 wherein said generator means adjusts the size of each of said output circuit cells to corresponds to the number of information bits for each of said words specified in the parameters input to said input means.

14. The apparatus of claim 9 wherein said second plurality of cells further include an address buffer cell for storing memory addresses used to access said addressable memory cells.

15. The apparatus of claim 14 wherein said generator means adjusts the size of said address buffer cell to correspond to the number of words to be stored in said RAM specified in the parameters input to said input means.

16. A method of generating an integrated circuit module, said method comprising:
   specifying a plurality of parameters designating the characteristics of said integrated circuit module;
   providing a plurality of respective cells for a variety of integrated circuit subcomponent types, each type of said cells corresponding to a respective subcomponent of the integrated circuit module; and combining a plurality of said cells to form said integrated circuit module, the number and type of said cells used in the integrated circuit module varies according to said parameters; and arranging the topology and interconnection pattern of at least some of said cells as a function of a characteristics of another of said cells.

17. The method of claim 16 further including the step of arranging the topology of at least some of said cells as a function of the number of cells of another type that are included in said integrated circuit module.

18. The method of claim 16 further including the step of arranging the topology of at least some of said cells as a function of the size of another cell that is included in said integrated circuit module.

19. The method of claim 16 further including the step of specifying a plurality of foundry-specific design rules as part of said parameters, and wherein said step of arranging the topology of at least some of said cells includes the step of calculating constraints in the geometric relationships between said cells based on said design rules.

20. The method of claim 16 wherein said step of combining a plurality of cell to form said integrated circuit module include the steps of:

generating a floor plan of said cells by determining the respective positions of said cells;

routing interconnections between said cells; and generating data that described the geometry of said integrated circuit module.

21. The method of claim 20 wherein said step of arranging the topology of at least some of said cells includes the steps of:

pitch matching those of said cells that interact with another of said cells; and determining the required buffer sizes of those of said cells that interact with another of said cells based on the respective capacitive loading of each of said cells.

22. The method of claim 21 wherein said step of determining the required buffer sizes of said interacting cells includes the steps of calculating the load capacitance of the output of each cell based on a predetermined initial driver size, and modifying each of said required buffer sizes by calculating the additional capacitance which must be added as a function of a new buffer size thereby calculating the final buffer size.

23. The method of claim 16 wherein said integrated circuit module is for a multiport random access memory (RAM), and wherein said step of specifying a plurality of parameters designating the characteristics of said integrated circuit module includes the steps of specifying the number of words to be stored in said RAM, the number of information bits for each of said words, the number of write ports for said RAM, and the number of read ports for said RAM.

24. The method of claim 23 wherein said integrated circuit module includes a core of addressable memory cells and at least one data input circuit cell, and wherein said input circuit cells correspond in number to the number of write ports specified in said parameters.

25. The method of claim 23 wherein said integrated circuit module includes a core of addressable memory cells and at least one data input circuit cell, and wherein said step of arranging the topology of at least some of said cells as a function of a characteristic of another of said cells further includes the step of adjusting the sizes of each of said input circuit cells to correspond to the number of information bits for each of said words specified in said parameters.

26. The method of claim 23 wherein said integrated circuit module includes a core of addressable memory cells and at least one data circuit cell, and wherein said output circuit cells correspond in number to the number of read ports specified in said parameters.

27. The method of claim 23 wherein said integrated circuit module includes a core of addressable memory cells and at least one data output circuit cell, and wherein said step of arranging the topology of at least some of said cells as a function of a characteristic of another of said cells further includes the step of adjusting the sizes of each of said output circuit cells to correspond to the number of information bits for each of said words specified in said parameters.

28. The method of claim 23 wherein said integrated circuit module includes a core of addressable memory cells and an address buffer cell for storing memory addresses used to access said addressable memory cells, and wherein said step of arranging the topology of at least some of said cells as a function of a characteristic of another of said cells further includes the step of adjusting the size of said address buffer cell to correspond to the number of words to be stored in said RAM specified in said parameters.

* * * * *

UNITED STATES PATENT AND TRADEMARK OFFICE
CERTIFICATE OF CORRECTION

PATENT NO. : 5,210,701
DATED : May 11, 1993
INVENTOR(S) : Haytham H. Hana and Syed J. Hussain It is certified that error appears in the above-identified patent and that said Letters Patent is hereby corrected as shown below:

In column 12, claim 11, line 40, after "said" and before "means", please insert --input--.

In column 13, claim 16, line seven, please delete "characteristics" and substitute therefor --characteristic--.

In column 13, claim 20, line 30, please delete "described" and substitute therefor --describes--.

Signed and Sealed this

Eleventh Day of January, 1994

Attest:

BRUCE LEHMAN

*Attesting Officer*    *Commissioner of Patents and Trademarks*